United States Patent
Smith et al.

(10) Patent No.: US 6,513,654 B2
(45) Date of Patent: Feb. 4, 2003

(54) SMIF CONTAINER INCLUDING AN ELECTROSTATIC DISSIPATIVE RETICLE SUPPORT STRUCTURE

(75) Inventors: Mark V. Smith, Colorado Springs, CO (US); Robert P. Wartenbergh, Woodside, CA (US); William P. Pennybacker, Tracy, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/902,519

(22) Filed: Jul. 10, 2001

(65) Prior Publication Data

US 2002/0066692 A1 Jun. 6, 2002

Related U.S. Application Data

(60) Provisional application No. 60/217,177, filed on Jul. 10, 2000.

(51) Int. Cl.[7] .......................... B65D 85/48; B65D 85/90
(52) U.S. Cl. ........................ 206/454; 206/710
(58) Field of Search ................. 206/710, 711, 206/453–455, 719, 722–724; 211/41; 141/98; 414/217

(56) References Cited

U.S. PATENT DOCUMENTS

| | | | | |
|---|---|---|---|---|
| 3,615,006 A | * | 10/1971 | Freed | 206/454 |
| 4,776,462 A | * | 10/1988 | Kosugi et al. | 206/454 |
| 4,995,430 A | * | 2/1991 | Bonora et al. | 414/217 |
| 5,375,710 A | * | 12/1994 | Hayakawa et al. | 206/724 |
| 5,469,963 A | | 11/1995 | Bonora et al. | |
| 5,577,610 A | * | 11/1996 | Okuda et al. | 206/454 |
| 5,611,452 A | | 3/1997 | Bonora et al. | |
| 5,725,100 A | * | 3/1998 | Yamada | 206/724 |
| 6,216,873 B1 | * | 4/2001 | Fosnight et al. | 206/454 |

\* cited by examiner

*Primary Examiner*—Luan K. Bui
(74) *Attorney, Agent, or Firm*—O'Melveny & Myers LLP

(57) ABSTRACT

The present invention is a support structure for supporting a reticle or silicon wafer. The support structure includes a support column and a retaining structure. In addition to retaining a wafer, the present invention also creates a discharge path to remove electrostatic charges from the wafer. The retaining structure mechanically engages each support column to create a discharge path from the wafer to a ground. Specifically, electrostatic charges that dissipate from the wafer travel along the support structure to the support column and exit the SMIF pod through the pod door.

15 Claims, 3 Drawing Sheets

SMIF CONTAINER INCLUDING AN ELECTROSTATIC DISSIPATIVE RETICLE SUPPORT STRUCTURE

This application claims priority from provisional application "SMIF CONTAINER INCLUDING AN ELECTROSTATIC DISSIPATIVE RETICLE SUPPORT", Application No. 60/217,177, filed Jul. 10, 2000, and incorporated herein by reference.

CROSS REFERENCE TO RELATED APPLICATION

This application is related to U.S. patent application Ser. No. 09/272,132, entitled, "SMIF CONTAINER INCLUDING A RETICLE SUPPORT STRUCTURE", to Fosright et al., which application is incorporated by reference herein in its entirety and which application is assigned to the owner of the present application.

BACKGROUND OF THE INVENTION

1. Field of the Invention

The present invention relates to a standardized mechanical interface (SMIF) container for transferring workpieces such as reticles in a semiconductor or reticle fab, and in particular to a container including a static dissipative support structure mounted to the container shell and grounded to the container door for dissipating static electric charge from contact points on the top side of the reticle.

2. Description of the Related Art

Semiconductor devices are made up of as many as fifty individual patterned layers of silicon, silicon compounds and metals. During fabrication of these devices, the pattern for each of these layers is contained on a mask called a reticle. A reticle is an optically clear quartz substrate on which a pattern has been formed by photolithography or other such processes. In particular, a layer of photoresist is applied on a chrome coated reticle blank. Thereafter, the pattern for a particular layer to be formed on a semiconductor wafer is transferred onto the reticle as for example by a laser pattern generator or e-beam. After pattern generation on the photoresist, the exposed portions of the photoresist are removed to leave the unwanted portions of the chrome layer exposed. These unwanted portions are then etched away. The remaining photoresist is then removed in a process which leaves the clean pattern on the surface on the reticle.

In order to keep the surface of the reticle clean, a thin transparent sheet called a pellicle is mounted a short distance away from the surface of the reticle containing the pattern. This ensures that any microscopic dust that settles on the reticle will be out of focus during the exposure process so as not to affect the pattern formed on the silicon wafer.

During fabrication of the reticle, it is important to minimize airborne particle fluxes onto the surface of the reticle on which the pattern is being formed, as any such particles can corrupt the pattern. Even after formation of the pattern and affixation of the pellicle, larger, or macro, contaminants can settle on the reticle which can interfere with pattern transference onto the semiconductor wafer. It would therefore be advantageous to shield the reticles from the external environment during reticle fabrication, during transfer of the reticle from the reticle fab to the semiconductor fab, and during usage of the reticle in the semiconductor fab.

In addition to exposing the reticle to airborne particulates, physical handling of a reticle during transfer can also damage a reticle. Common causes of damage when handling reticles include scratches, electrostatic discharge onto the reticle, and cracking of the reticle and/or pellicle.

In a semiconductor wafer fab, it is therefore known to store and transfer workpieces such as semiconductor wafers using a standard mechanical interface, or SMIF, system. The SMIF system was developed by the Hewlett-Packard Company and disclosed in U.S. Pat. Nos. 4,532,970 and 4,534,389. The purpose of a SMIF system is to reduce particle fluxes onto workpieces such as reticles and semiconductor wafers during storage and transport of the workpieces through the fabrication process. This purpose is accomplished, in part, by mechanically ensuring that during storage and transport, the gaseous media (such as air or nitrogen) surrounding the workpieces is essentially stationary relative to the workpieces and by ensuring that particles from the ambient environment do not enter the immediate workpiece environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, Solid State Technology, July 1984, pp. 111–115.

A SMIF system has three main components: (1) sealed containers, having a minimal volume, used for storing and transporting workpieces and/or cassettes which hold the workpieces; (2) enclosures placed over access ports and workpiece processing areas of processing equipment so that the environments inside the containers and enclosures (after having clean air sources) become miniature clean spaces; and (3) a transfer mechanism to load/unload workpieces and/or workpiece cassettes from a sealed container without contamination of the workpieces from external environments.

Electrostatic buildup on and discharge from reticles can damage or destroy the reticles, and concern about electrostatic damage has been increasing in recent years as device geometries get finer and the requirements for reliability become more stringent. In conventional SMIF pods, it is known to have conductive contacts on the reticle support in the pod door to dissipate electrostatic charge from the bottom surface of the reticle. The charge is then grounded through the pod door. Similarly, conductive contacts are provided on the reticle retainer in the pod shell to dissipate electrostatic charge from the top surface of the reticle. The charge from the top surface is then grounded through the pod shell.

A drawback to conventional reticle containers is that the shell must include static dissipative materials to provide a path to ground for the static charge from the top surface of the reticle. It is desirable that the shell be transparent so that the reticle can be viewed from the outside. However, the agents that make the shell statically dissipative cloud the shell and reduce its transparency.

SUMMARY OF THE INVENTION

The invention solves the drawbacks of prior reticle containers by providing a conductive path between the reticle retainer and the reticle supports. This allows electrostatic charge to be dissipated from the top surface of the reticle without the use of static dissipative materials in the pod shell. Since there is no need for static dissipative materials in the pod shell, the pod shell may be transparent to allow the viewing of the reticle within the reticle container.

In an embodiment, an apparatus for supporting an object within a SMIF pod, comprises a first support structure and a second support structure for supporting the object; and a retaining structure. The retaining structure includes first and second tabs for engaging the first and second support structures, respectively, to create a discharge path between the retaining structure and the first and second support structures. The retaining structure further includes means for preventing movement of the object within the SMIF pod during SMIF pod transport.

In a further embodiment, the first and second support structures are mechanically interconnected with a SMIF pod door. In an embodiment, the retaining structure is mechanically interconnected with a SMIF pod shell. In an additional embodiment, the first and second support structures and the retaining structure are formed of a substantially rigid, low particulating and electrostatically dissipative material.

In an alternate embodiment, an apparatus for supporting an object within a SMIF pod comprises at least two support structures mechanically interconnected with the SMIF pod door for supporting the object; and at least one retaining structure mechanically interconnected with the SMIF pod shell. Each retaining structure has a first tab and a second tab for engaging the support structures when the SMIF pod shell forms a seal with the SMIF pod door. This creates a discharge path between the support structures and the retaining structure, and further preventing movement of the object within the SMIF pod during SMIF pod transport. In a further embodiment, the support structures and the retaining structure are formed of a substantially rigid, low particulating and electrostatically dissipative material.

In yet another embodiment, a SMIF pod for supporting an object comprises a pod door having an interior surface having at least two electrically conductive columns mechanically interconnected with the interior surface to support the object. The SMIF pod also comprises a pod shell with an interior surface having at least one electrically conductive arm mechanically interconnected with the interior surface and having tabs for engaging the columns. The SMIF pod further comprises a discharge path, which is created between the column and the arm when the pod shell engages the pod door. In a further embodiment, the arm retains the object when the pod shell engages the pod door. In an additional embodiment, the column and the arm are formed of a substantially rigid, low particulating and electrostatically dissipative material.

In yet another embodiment, a SMIF pod for supporting an object comprises a pod door having an interior surface with four electrically conductive columns. The four electrically conductive columns are mechanically interconnected with the interior surface to support the object. The SMIF pod further comprises a pod shell having an interior surface with electrically conductive arms. The electrically conductive arms are mechanically interconnected with the interior surface. Each arm has a first and second tab, which create a discharge path between the columns and the arms when the first and second tabs of each arm engage the columns.

In a further embodiment, the arms further retain the object when the pod shell engages the pod door. In a further embodiment, the columns further remove electrostatic charges from a bottom surface of the object. In a further embodiment, the arms remove electrostatic charges from a top surface of the object. In a further embodiment, the columns and the arms are formed of a substantially rigid, low particulating and electrostatically dissipative material.

In an alternate embodiment, a SMIF pod for supporting an object comprises a pod door having an interior surface with four electrically conductive columns mechanically interconnected with the interior surface to support the object and further removing electrostatic charges from a bottom surface of the object. The SMIF pod further comprises a pod shell having an interior surface with electrically conductive arms mechanically interconnected with the interior surface. Each arm has a first and second tab, and further removes electrostatic charges from a top surface of the object. The SMIF pod further comprises a discharge path, which is created between the columns and the arms when the first and second tabs of each arm engages the columns.

BRIEF DESCRIPTION OF THE DRAWINGS

The present invention will now be described with reference to the drawings in which.

DETAILED DESCRIPTION

The present invention will now be described with reference to FIGS. 1 and 2, which in general relate to a container including an electrostatic dissipative (ESD) support structure for supporting a reticle. While the present invention is described with respect to a SMIF container, it is understood the present invention may be used with any of various containers for storing and transferring reticles or similar workpieces. Additionally, a preferred embodiment of the present invention complies with, and allows compliance with, all applicable SEMI standards.

Figure 1:
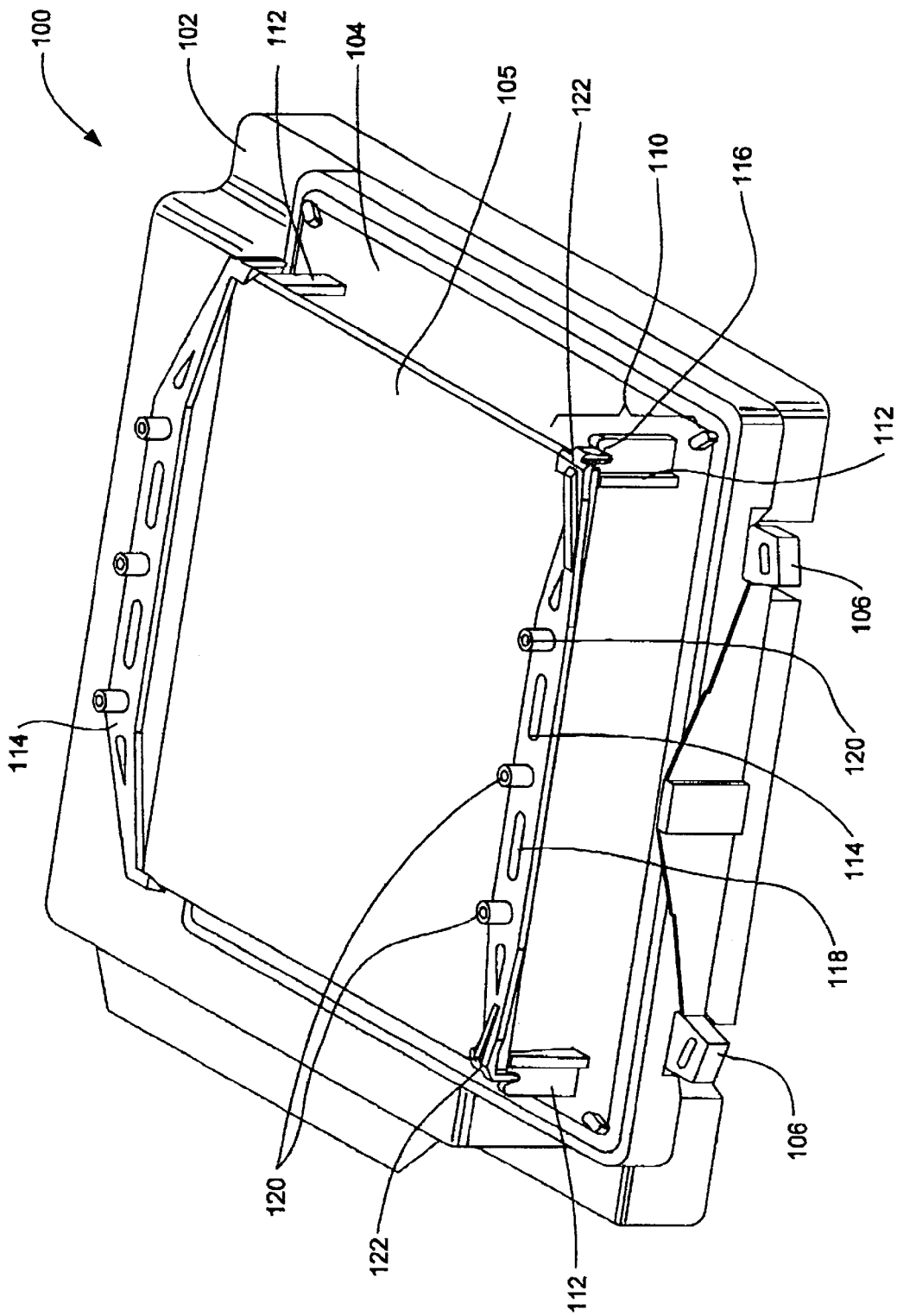
FIG. 1 is a perspective view showing a container and reticle support mechanism according to the present invention.

Referring now to FIG. 1, there is shown a container 100 comprising a shell 102 capable of mating with a door 104 to define a sealed environment within the container for storing and transporting a reticle 105. Although not critical to the present invention, door 104 preferably includes a latch mechanism for allowing the shell 102 to be removably coupled to the door. Such a latch mechanism comprises four independent latches 106 which may be moved outward by laterally actuating pins (not shown) on a load port on which the pod is seated. Such a latching mechanism may additionally include a locking mechanism to prevent unwanted opening of the pod. This locking mechanism is disclosed in U.S. Provisional Patent Application No. 60/217,204, entitled, "SMIF CONTAINER WITH LATCH LOCK MECHANISM", to Smith et al., filed on Jul. 10, 2000 and owned by the owner of the present invention. Details relating to an alternative latching mechanism are shown for example in U.S. Pat. No. 4,995,430, entitled "SEALABLE TRANSPORTABLE CONTAINER HAVING IMPROVED LATCH MECHANISM", to Bonora et al., which patent is assigned to the owner of the present application and which patent is incorporated by reference in its entirety herein.

The container door is preferably formed of a static disapative, durable polymer, such as for example carbon fiber-filled polycarbonate. The container shell is preferably formed of a durable polymer, such as polycarbonate, and is clear to allow the viewing of the reticle as explained hereinafter. As an alternative to polycarbonate, the door and/or shell may further be formed of flame retardant polyetherimide. It is understood that the door and shell may be formed of other materials in alternative embodiments. However, it is a feature of the present invention that the shell 102 need not include static dissipative materials. The door and shell are preferably formed by injection molding, but other known methods of manufacture are contemplated.

Container 100 further includes a reticle support mechanism 110 mounted within an interior of the container 100. Reticle support mechanism 110 includes four reticle supports 112 mounted to or formed on door 104 and a pair of reticle retainers 114 mounted to shell 102. Supports 112 and retainers 114 of the reticle support mechanism 110 allow a reticle to be quickly and easily positioned within and removed from container 100, prevent movement of the reticle within the container during container transport, and provide a path to ground for electrostatic dissipation from the top and bottom surface of the reticle.

In a preferred embodiment, the reticle supports 112 and retainers 114 are formed of a substantially rigid, low particulating and electrostatically dissipative material such as for example carbon fiber-filled polyetheretherkeytone ("PEEK"). It is understood that various other materials including polycarbonate, polyetherimide, or other compositions may be used.

Reticle supports 112 may support the reticle any number of ways. A chamfer is conventionally provided around a lower edge of reticle 105. In a preferred embodiment, the four supports 112 support the reticle along the lower edge chamfer, at the corners of the reticle. It is understood that other known mechanisms may be used for contacting and supporting the reticle on the pod door in alternative embodiments. For example, the reticle supports may contact the reticle along its edges as opposed or in addition to at its corners, and/or may contact the bottom side of the reticle. When seated on a load port, stand alone station or other support structure, the pod is typically supported on registration pins that mate in corresponding slots on a bottom surface of the pod door. Other registration features for supporting the pod on a support surface are known. When seated on a support surface, electrostatic charges are dissipated from the bottom surface of the reticle along a path through the reticle supports 112, through the pod door 104, through the registration features supporting the pod, and from the registration features to ground.

Figure 3:
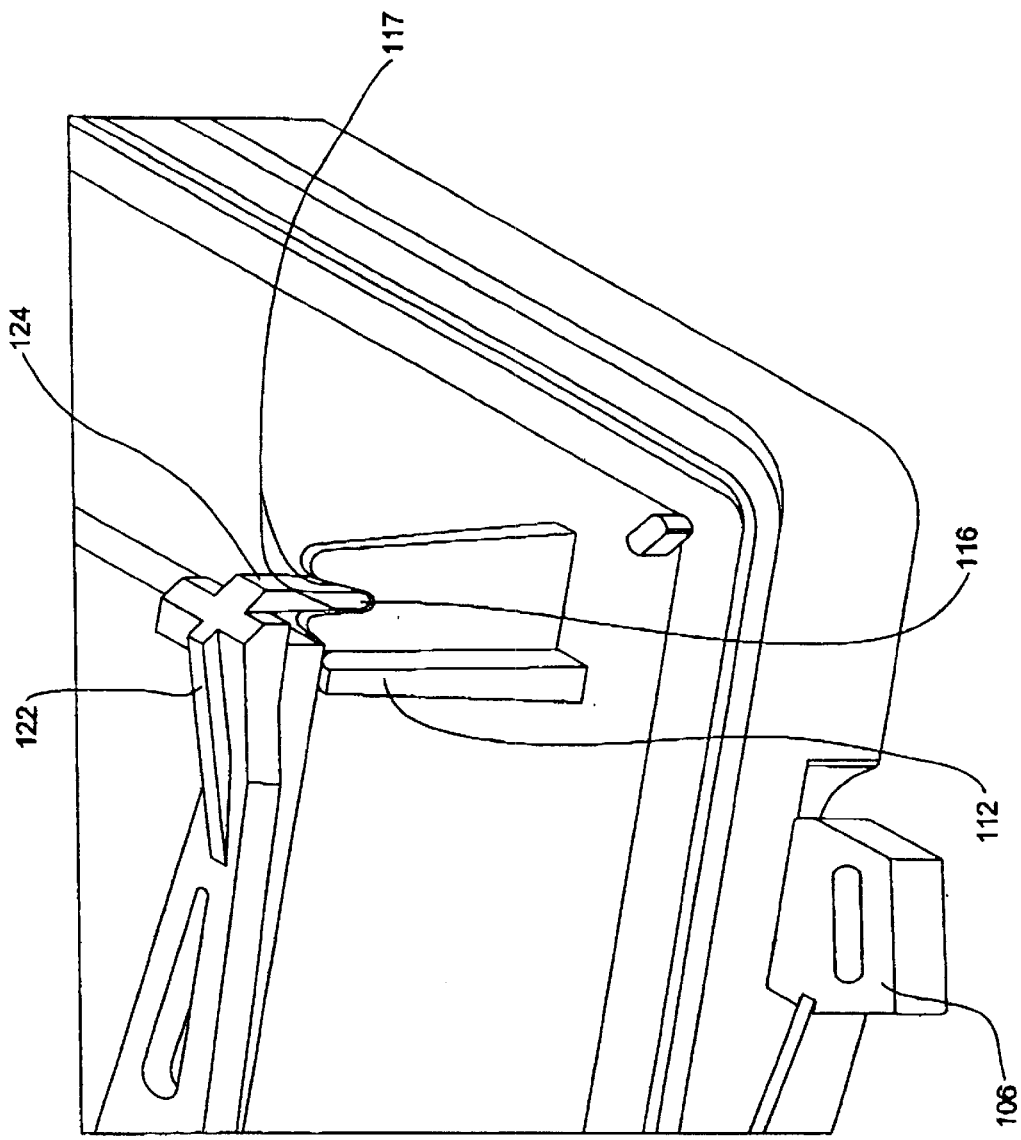
FIG. 3 is a perspective view of an embodiment of the present invention illustrating the mechanical interlock between the support column and the retaining structure.

In addition to structure for supporting the reticle 104, each reticle support 112 further includes a tab receiver 116 for receiving a tab formed on the reticle retainers 114 as explained in greater detail below. As best seen in FIG. 3, the tab receiver 116 comprises a detent defined by inwardly sloping sidewalls 117.

Figure 2:
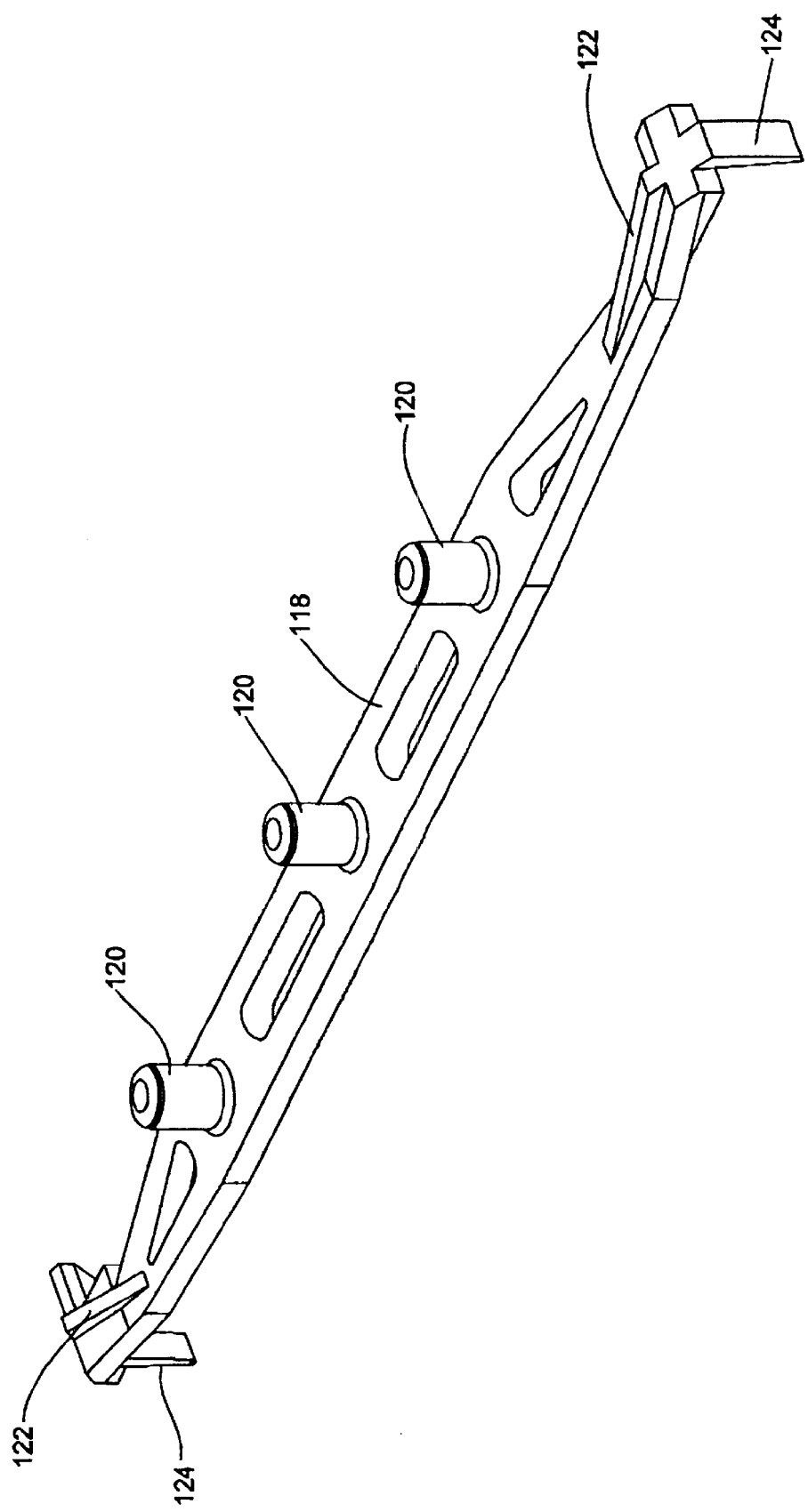
FIG. 2 is an enlarged perspective view showing a tab on the reticle retainer and tab receiver on the reticle support for dissipating an electrostatic charge from the top surface of the reticle through the pod door.

Referring now to FIGS. 1–3, reticle retainers 114 may retain the reticle in position any number of ways upon mating the pod shell with the pod door. In one embodiment, the two retainers 114 each include a base portion 118 which is mounted to container shell 102 by one or more bosses 120 on the upper surface of the reticles. A chamfer is conventionally provided around an upper edge of reticle 105. Each reticle retainer further includes two end portions 122 provided for contacting the upper chamfer of reticle 105, at the corners of the reticle, when the pod shell is mated to the pod door to hold the reticle in place when the pod is sealed. It is understood that other known mechanisms may be used for contacting and retaining the reticle in position when the pod is sealed in alternative embodiments. For example, the reticle retainers may contact the reticle along its edges as opposed or in addition to at its corners, and/or may contact the top side of the reticle.

The reticle retainers further provide a current flow path for the electrostatic charge away from the top surface of the reticle. In particular, the reticle retainers further include dissipative tabs 124 mounted to one or both reticle retainers, which tabs extend down over the sides of the reticle and into contact with the respective tab receivers 116 on the pod door. In a preferred embodiment, there are two such dissipative tabs 124, one each on the ends of one of the reticle retainers. When seated on a support surface, electrostatic charges are dissipated from the top surface of the reticle along a path through the ends of the reticle retainer 114 in contact with the reticle, through the dissipative tabs 124 on the reticle retainers to the tab receivers 116 on the reticle supports, through the reticle supports to the pod door, through the pod door 104 to the registration features supporting the pod, and through the registration features to ground.

The manner of contact between the dissipative tabs 124 and tab receivers 116 may vary in alternative embodiments. In one embodiment, each tab 124 is slightly flexible so as to deflect in a direction substantially perpendicular to its length. In such an embodiment, a slight interference, on the order of about 0.010 inches, may be provided between the tabs and one of the sidewalls 117 of the tab receivers so that, when the pod shell is mated with the pod door, each tab slides against one of the sidewalls 117. Contact between each tab 124 and a sidewall 117 slightly deflects the tab. This interference ensures contact between the tabs and the tab receivers upon closing the pod. In this embodiment, the tabs 124 do not contact the bottom of the detent where the two sidewalls 117 defining each tab receiver meet. The reticle support and/or reticle retainer may include a low friction material, such as Teflon7 to prevent the generation of particulates upon contact between the tabs and tab receivers.

It is understood that other known schemes may be provided for electrically coupling the reticle retainers 114 to the reticle supports 112 upon closure of the pod to provide a path to ground off of the top surface of the reticle through the pod door. For example, instead of sliding against a sidewall 117, the tabs may exert a force straight down on a receiving surface (not shown) of the receiving tab, which surface is capable of deflection. Thus, when the pod shell is mated to the pod door, the tab contacts the receiving surface to establish an electrical coupling between the tab and tab receiver. The deflection of the receiving surface prevents the contact between the tab and tab receiver from interfering with the support of the reticle between the reticle supports 112 and reticle retainers 114.

Although the present invention has been described thus far as supporting a square or rectangular reticle, it is understood that the present invention may be used to firmly support and electrostatically dissipate other workpieces within a container during storage and transport. Additionally, it is understood that the workpiece may be round or curvilinear. In such an embodiment, the respective reticle supports and retainers would be modified to replace the angled sidewalls with continuously curved sidewalls configured to match the outer circumference of the workpiece.

Although the invention has been described in detail herein, it should be understood that the invention is not limited to the embodiments herein disclosed. Various changes, substitutions and modifications may be made thereto by those skilled in the art without departing from the spirit or scope of the invention.

What is claimed is:

1. An apparatus for supporting an object within a SMIF pod, comprising:
   a first support structure and a second support structure for supporting the object; and
   a retaining structure, including:
      first and second tabs, each first and second tab engaging respective ones of said first and second support structures, creating a discharge path between said retaining structure and said first and second support structures;
      means for preventing movement of the object within the SMIF pod during SMIF pod transport.

2. The system as recited in claim 1, wherein said first and second support structures are mechanically interconnected with a SMIF pod door.

3. The system as recited in claim 1, wherein said retaining structure is mechanically interconnected with a SMIF pod shell.

4. The system as recited in claim 1, wherein said first and second support structures and said retaining structure are formed of a substantially rigid, low particulating and electrostatically dissipative material.

5. An apparatus for supporting an object within a SMIF pod, comprising:
   at least two support structures mechanically interconnected with the SMIF pod door for supporting the object; and
   at least one retaining structure mechanically interconnected with the SMIF pod shell, each said retaining structure having a first tab and a second tab, said first and second tab engaging said support structures when the SMIF pod shell forms a seal with the SMIF pod door, creating a discharge path between said support structures and said retaining structure, and further preventing movement of the object within the SMIF pod during SMIF pod transport.

6. The apparatus as recited in claim 5, wherein said support structures and said retaining structure are formed of a substantially rigid, low particulating and electrostatically dissipative material.

7. A SMIF pod for supporting an object, comprising:
   a pod door having an interior surface, said interior surface having at least two electrically conductive columns mechanically interconnected with said interior surface to support the object;
   a pod shell having an interior surface, having at least one electrically conductive arm mechanically interconnected with said interior surface, each arm having tabs for engaging said columns; and
   a discharge path, created between said column and said arm when said pod shell engages said pod door.

8. The SMIF pod as recited in claim 7, wherein said arm further retains the object when said pod shell engages said pod door.

9. The SMIF pod as recited in claim 7, wherein said column and said arm are formed of a substantially rigid, low particulating and electrostatically dissipative material.

10. A SMIF pod for supporting an object, comprising:
    a pod door having an interior surface, said interior surface having four electrically conductive columns mechanically interconnected with said interior surface to support the object;
    a pod shell having an interior surface, said interior surface having electrically conductive arms mechanically interconnected with said interior surface, each arm having a first and second tab; and
    a discharge path, created between said column and said arm when said first and second tab of each arm engages said column.

11. The SMIF pod as recited in claim 10, wherein said arms further retain the object when said pod shell engages said pod door.

12. The SMIF pod recited in claim 10, wherein said columns further remove electrostatic charges from a bottom surface of the object.

13. The SMIF pod as recited in claim 10, wherein said arms further remove electrostatic charges from a top surface of the object.

14. The SMIF pod as recited in claim 10, wherein said column and said arm are formed of a substantially rigid, low particulating and electrostatically dissipative material.

15. A SMIF pod for supporting an object, comprising:
    a pod door having an interior surface, said interior surface having four electrically conductive columns mechanically interconnected with said interior surface to support the object, said columns further removing electrostatic charges from a bottom surface of the object;
    a pod shell having an interior surface, said interior surface having electrically conductive arms mechanically interconnected with said interior surface, each arm having a first and second tab, each arm further removing electrostatic charges from a top surface of the object; and
    a discharge path, created between said column and said arm when said first and second tab of each arm engages said column.

* * * * *